(12) United States Patent
Kong et al.

(10) Patent No.: US 8,239,726 B2
(45) Date of Patent: Aug. 7, 2012

(54) APPARATUSES AND METHODS FOR ENCODING AND DECODING

(75) Inventors: Jun Jin Kong, Yongin-si (KR); Sung Chung Park, Daejeon (KR); Seung-Hwan Song, Incheon (KR); Jong Han Kim, Suwon-si (KR); Young Hwan Lee, Suwon-si (KR); Kyoung Lae Cho, Yongin-si (KR); Nam Phil Jo, Seoul (KR); Sung-Jae Byun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1036 days.

(21) Appl. No.: 12/010,025

(22) Filed: Jan. 18, 2008

(65) Prior Publication Data

US 2009/0027238 A1 Jan. 29, 2009

(30) Foreign Application Priority Data

Jul. 25, 2007 (KR) .................. 10-2007-0074613

(51) Int. Cl.
*H03M 13/00* (2006.01)

(52) U.S. Cl. ........ 714/755; 714/790; 714/784; 714/781; 714/786; 714/746; 714/775; 714/780; 714/795; 714/792; 714/793; 714/773; 714/794; 714/752; 714/799; 714/763; 375/298; 375/265; 375/262; 375/264; 375/348; 375/267; 370/333; 365/185.09; 365/185.03

(58) Field of Classification Search .......... None
See application file for complete search history.

(56) References Cited

U.S. PATENT DOCUMENTS

| | | | | |
|---|---|---|---|---|
| 5,706,312 A * | 1/1998 | Wei | ........ | 375/298 |
| 6,202,189 B1 * | 3/2001 | Hinedi et al. | ........ | 714/786 |
| 6,272,661 B1 * | 8/2001 | Yamaguchi | ........ | 714/795 |
| 6,598,203 B1 * | 7/2003 | Tang | ........ | 714/790 |
| 6,606,724 B1 * | 8/2003 | Krieger et al. | ........ | 714/755 |
| 6,986,092 B2 * | 1/2006 | Butler et al. | ........ | 714/752 |
| 7,631,243 B2 * | 12/2009 | Nieto | ........ | 714/755 |
| 7,765,457 B2 * | 7/2010 | Amer | ........ | 714/786 |
| 7,844,879 B2 * | 11/2010 | Ramamoorthy et al. | ...... | 714/763 |
| 2001/0025358 A1 * | 9/2001 | Eidson et al. | ........ | 714/752 |
| 2003/0106008 A1 * | 6/2003 | Butler et al. | ........ | 714/752 |
| 2004/0261002 A1 * | 12/2004 | Eidson et al. | ........ | 714/786 |
| 2007/0171714 A1 * | 7/2007 | Wu et al. | ........ | 365/185.09 |
| 2007/0283211 A1 * | 12/2007 | Nieto | ........ | 714/755 |
| 2011/0060969 A1 * | 3/2011 | Ramamoorthy et al. | ...... | 714/773 |

FOREIGN PATENT DOCUMENTS

| | | |
|---|---|---|
| JP | 2000-286719 | * 10/2000 |
| KR | 10-1998-0032653 | 7/1998 |
| KR | 10-2004-0089455 | 10/2004 |

* cited by examiner

*Primary Examiner* — John Trimmings
(74) *Attorney, Agent, or Firm* — Harness, Dickey & Pierce, P.L.C.

(57) ABSTRACT

A code encoding apparatus includes a delay circuit and a code generator. The delay circuit generates delayed information based on p-bit input information received in parallel. The delayed information is generated according to a clock. The code generator generates n·p-bit code based on at least one of the input information and the delayed information, where n is a rational number.

25 Claims, 14 Drawing Sheets

FIG. 2

| TIME | INPUT | $D_1 \; D_0$ | $C_0$ | $C_1$ |
|---|---|---|---|---|
| T=1 | $i_0 \; i_1$ | 0   0 | $i_0 + 0 + 0$<br>$i_1 + i_0 + 0$ | $i_0 + 0$<br>$i_1 + 0$ |
| T=2 | $i_2 \; i_3$ | $i_1 \; i_0$ | $C_0^a : i_2 + i_1 + i_0$<br>$C_0^b : i_3 + i_2 + i_1$ | $C_1^a : i_2 + i_0$<br>$C_1^b : i_3 + i_1$ |
| T=3 | $i_4 \; i_5$ | $i_3 \; i_2$ | $i_4 + i_3 + i_2$<br>$i_5 + i_4 + i_3$ | $i_4 + i_2$<br>$i_5 + i_3$ |

FIG. 4

| TIME | INPUT | $D_1\ D_0$ | $C_0$ | $C_1$ |
|---|---|---|---|---|
| T=1 | $i_0$ | 0   0 | $i_0 + 0 + 0$ | $i_0 + 0$ |
| T=2 | $i_1$ | $i_0$   0 | $i_1 + i_0 + 0$ | $i_1 + 0$ |
| T=3 | $i_2$ | $i_1$   $i_0$ | $C_0^a: i_2 + i_1 + i_0$ | $C_1^a: i_2 + i_0$ |
| T=4 | $i_3$ | $i_2$   $i_1$ | $C_0^b: i_3 + i_2 + i_1$ | $C_1^b: i_3 + i_1$ |
| T=5 | $i_4$ | $i_3$   $i_2$ | $i_4 + i_3 + i_2$ | $i_4 + i_2$ |
| T=6 | $i_5$ | $i_4$   $i_3$ | $i_5 + i_4 + i_3$ | $i_5 + i_3$ |

FIG. 9

| TIME | INPUT | $D_1\ D_0$ | $C_0$ | $C_1$ |
|---|---|---|---|---|
| T=1 | $i_0^A$ | 0　0 | $i_0^A$ | $i_0^A$ |
| T=2 | $i_0^B$ | 0　0 | $i_0^B$ | $i_0^B$ |
| T=3 | $i_1^A$ | $i_0^A$　0 | $i_0^A + i_1^A$ | $i_0^A$ |
| T=4 | $i_1^B$ | $i_0^B$　0 | $i_0^B + i_1^B$ | $i_0^B$ |
| T=5 | $i_2^A$ | $i_1^A\ i_0^A$ | $i_0^A + i_1^A + i_2^A$ | $i_0^A + i_2^A$ |
| T=6 | $i_2^B$ | $i_1^B\ i_0^B$ | $i_0^B + i_1^B + i_2^B$ | $i_0^B + i_2^B$ |

APPARATUSES AND METHODS FOR ENCODING AND DECODING

PRIORITY STATEMENT

This non-provisional U.S. patent application claims priority under 35 U.S.C. § 119 to Korean Patent Application No. 10-2007-0074613, filed on Jul. 25, 2007, in the Korean Intellectual Property Office (KIPO), the entire contents of which are incorporated herein by reference.

BACKGROUND

Description of Related Art

A conventional single-level cell (SLC) memory device (sometimes referred to as a single-bit cell (SBC) memory) stores one bit of data in a single memory cell. The SLC memory stores and reads one-bit data based on distributions of a voltage level divided by a threshold voltage level programmed in a memory cell. For example, when a voltage level read from the memory cell is between 0.5 V and 1.5 V, stored data is read as a logic value of "1". When the voltage level read from the memory cell is between 2.5 V and 3.5 V, the stored data is read as a logic value of "0". The data stored in the memory cell is classified depending on the difference between cell currents and/or cell voltages during reading operations.

A conventional MLC memory device (sometimes referred to as a multi-bit cell (MBC) memory) stores data of two or more bits in a single memory cell. As the number of bits stored in the single memory cell increases, reliability may deteriorate and/or read-failure rate may increase. In one example, to store 'm' bits in a single memory cell, $2^m$ voltage level distributions are required. But, because the voltage window for a memory cell is limited, the difference in threshold voltage between adjacent bits may decrease as 'm' increases. As a result a read-failure rate may increase. For this reason, improving storage density using a conventional MLC memory devices may be relatively difficult.

SUMMARY

Example embodiments relate to encoding and/or decoding apparatuses and methods. Example embodiments also relate to multi-level cell (MLC) memory devices, and apparatuses and methods for encoding and/or decoding data stored in the MLC memory device and read from the MLC memory device.

Example embodiments may provide code encoding and/or decoding apparatuses and/or methods that apply a new error correction method to a multi-level cell (MLC) memory device and more stably increase a number of bits stored in a single memory cell.

Example embodiments may also provide code encoding and/or decoding apparatuses and/or methods that may reduce encoding and/or decoding time of an error correction code (ECC) for error correction.

Example embodiments also may provide code encoding and/or decoding apparatuses and/or methods that may reduce complexity of hardware required for encoding and decoding operations of an ECC.

According to example embodiments, a code encoding apparatus may include a delay circuit or unit and a code generator. The delay circuit may receive p-bit input information in parallel and generate delayed information according to a clock. The code generator may generate, in parallel, an n·p-bit code based on at least one of the input information and the delayed information, where n is a rational number.

According to another example embodiment, a code encoding and/or decoding apparatus may include an inner encoder and an outer encoder. The outer encoder may encode input information using an outer encoding scheme to generate an outer encoded bit stream. The inner encoder may encode an input information bit stream using an interleaved convolutional code encoding scheme to generate an inner encoded bit stream. An inner decoder may decode the inner encoded bit stream using a parallel Viterbi decoding scheme to restore the input information bit stream. An outer decoder may decode the outer encoded bit stream using an outer decoding scheme corresponding to the outer encoding scheme to restore the input information.

In an encoding method according to an example embodiment, p-bit input information may be received in parallel and delayed by at least one clock to generate delayed information. An n·p-bit code may be generated based on at least one of the input information and the delayed information. Each bit of the n·p-bit code may be generated in parallel based on at least one of each bit of the input information and each bit of the delayed information corresponding to each bit of the input information.

In an encoding/decoding method according to another example embodiment, input information may be encoded using an outer encoding scheme to generate an outer encoded bit stream and the outer encoded bit stream may be encoded using an interleaved convolutional code encoding scheme to generate an inner encoded bit stream. The inner encoded bit stream may be decoded using a parallel Viterbi decoding scheme to restore the outer encoded bit stream, and the outer encoded bit stream may be decoded using an outer decoding scheme corresponding to the outer encoding scheme to restore the input information.

At least one other example embodiment provides a computer-readable recording medium storing computer executable instructions that when executed cause a computer to perform a method including: delaying p-bit input information by at least one clock to generate delayed information, p being a rational number; and generating an n·p-bit code based on at least one of the input information and the delayed information, each bit of the n·p-bit code being generated in parallel from at least one of the input information and corresponding delayed information, where n is a rational number.

According to example embodiments, the n·p-bit code may be a convolutional code. An encoding apparatus may further include a puncturing circuit configured to generate a punctured code by puncturing the n·p-bit code. The outer encoder may encode the outer input information using one of a parallel Bose, Ray-Chaudhuri, Hocquenghem (BCH) code encoding scheme, a Reed-Solomon (RS) code encoding scheme, a non-binary code encoding scheme or the like. Apparatuses according to example embodiments may further include a memory configured to store the n·p-bit code. The memory may include a multi-bit cell (MBC) memory configured to store multi-bit data in one cell. The outer encoding scheme may be a linear block code encoding scheme.

According to example embodiments, the inner encoder may encode the outer encoded bit stream using an m-level interleaved convolutional code encoding scheme, and the inner decoder may decode, in parallel, the inner encoded bit stream of m bits corresponding to level of the interleaved convolutional code encoding scheme, where m is a rational number. The outer encoder may encode, in parallel, the input information of m bits corresponding to level of the interleaved convolutional code encoding scheme, and the outer decoder may decode, in parallel, the outer encoded bit stream of m bits corresponding to level of the interleaved convolutional code encoding scheme.

BRIEF DESCRIPTION OF THE DRAWINGS

The present invention will become more apparent and more readily appreciated from the following detailed description of example embodiments, taken in conjunction with the accompanying drawings, in which:

FIG. 2 is a table illustrating an example of a process of encoding a code in the encoding apparatus of FIG. 1;

FIG. 4 is a table illustrating an example of a process of encoding a code in the encoding apparatus of FIG. 3;

FIG. 9 is a table illustrating an example of a process of generating a code by the encoding apparatus of FIG. 8;

DETAILED DESCRIPTION OF EXAMPLE EMBODIMENTS

Figure 1:
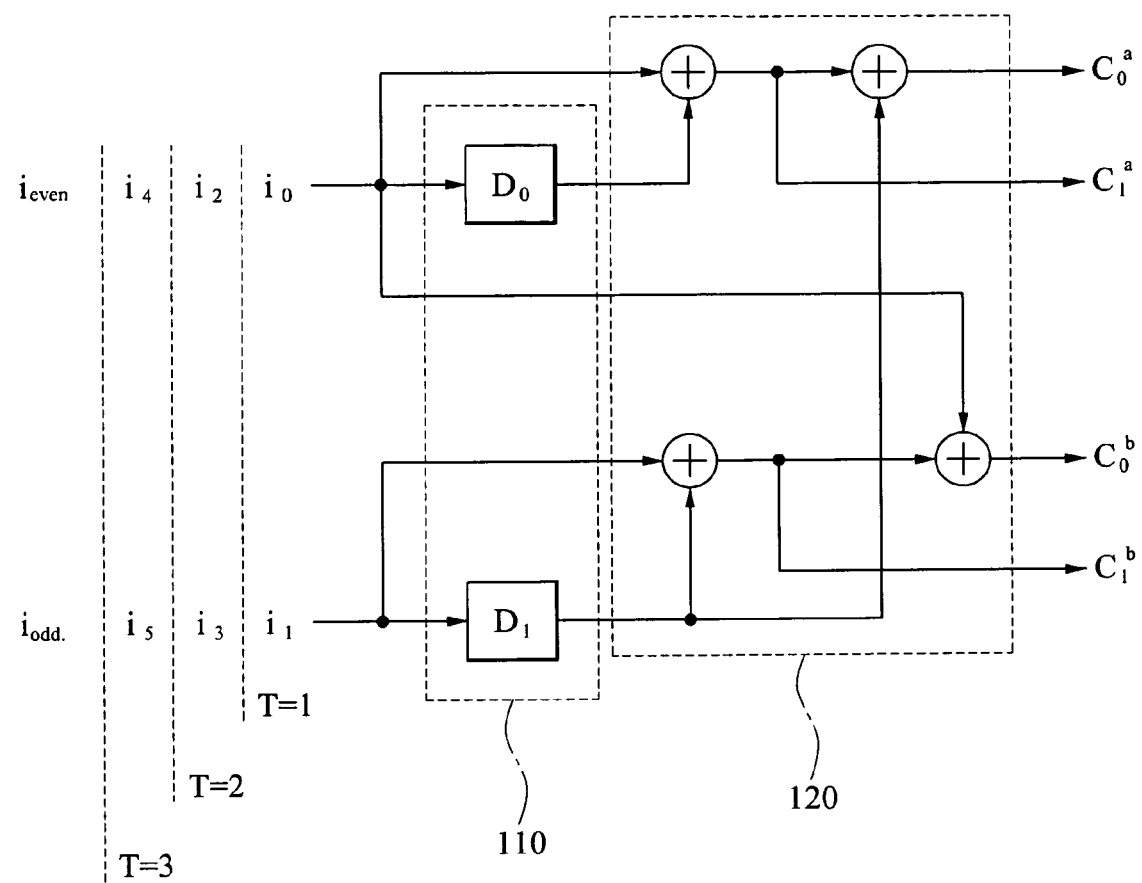
FIG. 1 is a diagram illustrating an encoding apparatus according to an example embodiment.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to," another component, it may be directly on, connected to, electrically connected to, or coupled to the other component or intervening components may be present. In contrast, when a component is referred to as being "directly on," "directly connected to," "directly electrically connected to," or "directly coupled to," another component, there are no intervening components present. As used herein, the term "and/or" includes any and all combinations of one or more of the associated listed items.

The terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a diagram illustrating an encoding apparatus according to an example embodiment.

Referring to FIG. 1, an encoding apparatus may include a delay circuit or unit 110 and a code generator 120. The delay circuit 110 may include delay elements $D_0$ and $D_1$. In example operation, the delay circuit 110 may receive multi-bit input information (e.g., 2-bit) in parallel and generate multi-bit delayed information according to a clock.

For example, when current input information is $i_{even}(T)$ and $i_{odd}(T)$, delayed information may be represented as $i_{even}(T-\tau)$ and $i_{odd}(T-\tau)$, respectively, where T indicates a current time and r indicates one clock. The delay circuit 110 may include one or more D flip-flops (D-FFs) operating in accordance with a clock (e.g., $\tau$).

Still referring to FIG. 1, the code generator 120 may generate multi-bit (e.g., four-bit) code based on at least one of the input information and the delayed information. As shown in FIG. 1, in at least one example embodiment, the code generator 120 may generate codes $C_0^a$, $C_1^a$, $C_0^b$, and $C_1^b$ based on $i_{even}(T)$, $i_{even}(T-\tau)$, $i_{odd}(T)$, and $i_{odd}(T-\tau)$. In this example, the codes $C_0^a$, $C_1^a$, $C_0^b$, and $C_1^b$ generated by the code generator may be represented by Equations 1-4 shown below.

$$C_0^a = i_{even}(T) + i_{even}(T-\tau) + i_{odd}(T-\tau) \quad \text{[Equation 1]}$$

$$C_1^a = i_{even}(T) + i_{even}(T-\tau) \quad \text{[Equation 2]}$$

$$C_0^b = i_{odd}(T) + i_{odd}(T-\tau) + i_{even}(T) \quad \text{[Equation 3]}$$

$$C_1^b = i_{odd}(T) + i_{odd}(T-\tau) \quad \text{[Equation 4]}$$

Codes generated by the code generator 120 of FIG. 1 where $\tau=1$ will be described in more detail with regard to FIG. 2.

FIG. 2 is a table for illustrating an encoding process performed by the encoding apparatus shown in FIG. 1.

Referring to FIG. 2, when T=1, current signal $i_{even}(T)=i_0$, current signal $i_{odd}(T)=i_1$, and the delay signals $i_{even}(T-\tau)$ and $i_{odd}(T-\tau)$ stored in the delay circuit 110 are 0. As a result, the code generator 120 may generate codes $C_0^a=i_0$, $C_1^a=i_0$, $C_0^b=i_0+i_1$, and $C_1^b=i_1$.

When T=2, $i_{even}(T)=i_2$, $i_{odd}(T)=i_3$, $i_{even}(T-\tau)=i_0$, and $i_{odd}(T-\tau)=i_1$, the code generator 120 may generate codes $C_0^a=i_2+i_1+i_0$, $C_1^a=i_2+i_0$, $C_0^b=i_3+i_2+i_1$, and $C_1^b=i_3+i_1$.

When T=3, $i_{even}(T)=i_4$, $i_{odd}(T)=i_5$, $i_{even}(T-\tau)=i_2$, and $i_{odd}(T-\tau)=i_3$, the code generator 120 may generate codes $C_0^a=i_4+i_3+i_2$, $C_1^a=i_4+i_2$, $C_0^b=i_5+i_4+i_3$, and $C_1^b=i_5+i_3$.

Figure 3:
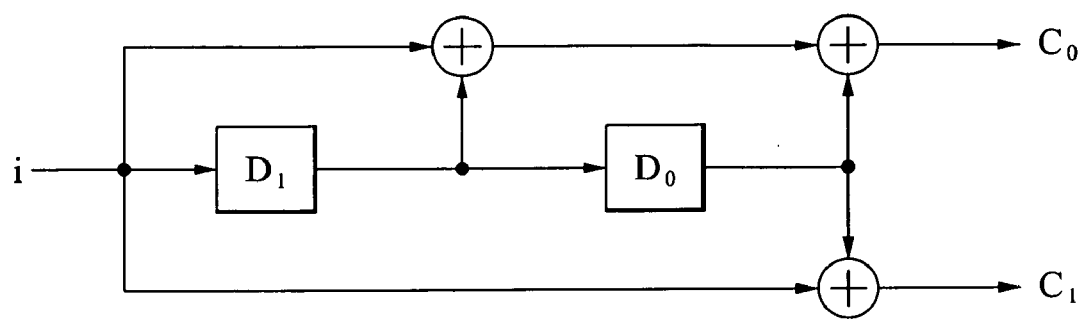
FIG. 3 illustrates an example of a more generic encoding apparatus according to an example embodiment.

FIG. 3 illustrates an example of a more generic encoding apparatus providing an equivalent code to the encoding apparatus of FIG. 1.

Referring to FIG. 3, the more generic encoding apparatus may receive input information i and generate codes $C_0$ and $C_1$ using a delay circuit unit and an adder. The delay unit may include a plurality of delay flip-flops $D_0$ and $D_1$.

An example process of generating the codes $C_0$ and $C_1$ will be described with reference to FIG. 4.

FIG. 4 is a table for illustrating an example encoding process performed by the encoding apparatus shown in FIG. 3. Referring to FIG. 4, when input information i at a current time T is i(T), then delayed information $D_0$ and $D_1$ may be represented by $i(T-2\tau)$ and $i(T-\tau)$, respectively. The codes $C_0$ and $C_1$ may be represented by Equations 5 and 6 shown below.

$$C_0 = i + D_1 + D_0 \quad \text{[Equation 5]}$$

$$C_1 = i + D_0 \quad \text{[Equation 6]}.$$

When T=1 in the table of FIG. 4 and T=1 in the table of FIG. 2, $C_0$ and $C_1$ may be the same as to $C_0^a$ and $C_1^a$ discussed above. When T=2 in the table of FIG. 4 and T=1 in the table of FIG. 2, $C_0$ and $C_1$ may be the same as to $C_0^b$ and $C_1^b$ discussed above. When T=3 in the table of FIG. 4, $C_0$ and $C_1$ may be the same as to $C_0^a$ and $C_1^a$ when T=2 as shown in FIG. 2. When T=4 in the table of FIG. 4, $C_0$ and $C_1$ may be the same as to $C_0^b$ and $C_1^b$ when T=2 as shown in FIG. 2. When T=5 in the table of FIG. 4, $C_0$ and $C_1$ may be the same as to $C_0^a$ and $C_1^a$ when T=3 in FIG. 2. When T=6 in the table of FIG. 4, $C_0$ and $C_1$ may be the same as $C_0$ and $C_1^b$ when T=3 in FIG. 2.

Like the encoding apparatus of FIG. 3, a conventional code encoding apparatus may also generate a code in series, rather than parallel. While providing a code equivalent to the code generated by the encoding apparatus of FIG. 3, the encoding apparatus of FIG. 1 may receive two-bit input information in parallel, perform a parallel encoding process with respect to the two-bit input information, and generate a four-bit code. Accordingly, the encoding process performed by the encoding apparatus of FIG. 3 in two clocks, may be performed by the encoding apparatus of FIG. 1 in a single clock.

While providing an equivalent code to the conventional encoding apparatus that generates a code in series, the encoding apparatuses according to example embodiments may receive p-bit input information in parallel, perform a parallel encoding process with respect to the p-bit input information, and generate an n·p bit code, wherein n is a rational number. In example embodiments, because the parallel encoding process may be performed with respect to the p-bit input information, encoding apparatuses according to example embodiments may reduce encoding process time to about 1/p. Encoding apparatuses according to example embodiments may encode p-bit input information to generate n·p bit code. Therefore, a code rate may be reduced to about 1/n.

When encoding apparatuses according to example embodiments are used for an error correction code (ECC), ECC performance may improve as the code rate decreases. But, when encoding apparatuses are embodied in hardware, area required for the hardware may increase as the number of bits of the code increases. Accordingly, although the ECC performance may be reduced, a code puncturing process for reducing the number of bits of the code may be useful in the encoding apparatus.

Accordingly, encoding apparatuses according to example embodiments may further include a puncturing unit or circuit (not shown). The puncturing unit may receive a code generated by the code generator 120 to generate a punctured code. The code puncturing process may include receiving the code generated by the code generator 120 and generating a new code including only a portion of bits of the generated code. The punctured code generated during a code puncturing process may have a comparatively higher code rate than the code generated by the code generator 120, but may include a comparatively smaller number of bits than the code generated by the code generator 120. Accordingly, when the encoding apparatus is embodied in hardware, the area required for the hardware may be reduced.

In example embodiments, when the code generated by the code generator 120 is a systematic code in which input information is explicitly distinguishable from redundant information, the code puncturing process may be realized through relatively simple hardware. Conversely, when the code generated by the code generator 120 is a non-systematic code in which input information is not explicitly distinguishable from redundant information, the code generated by the code generator 120 may be converted into a systematic code using a recursive process. For example, when a generator g of the non-systematic code with the code rate ½ is $g=(g_0, g_1)$, a generator g' corresponding to the converted non-systematic code using the recursive process may be represented as $g'=(1, g_1/g_0)$.

Referring back to FIG. 1, codes generated by the code generator 120 may be generated in parallel from at least one of each bit of input information and each bit of delayed information corresponding to the each bit of the input information.

If a path for generating $C_0^a$ and $C_1^a$ is referred to as 'a', path 'a' may be affected by both seven and $i_{odd}$ because $i_{odd}(T-\tau)$ is a delayed version of $i_{odd}(T)$. Similarly, if a path for generating $C_0^b$ and $C_1^b$ is referred to as 'b', path 'b' may be affected by both $i_{even}$ and $i_{odd}$ because $i_{even}(T-\tau)$ is a delayed version of $i_{even}(T)$.

According to example embodiments, a code generated by the code generator 120 may be a convolutional code.

Figure 5:
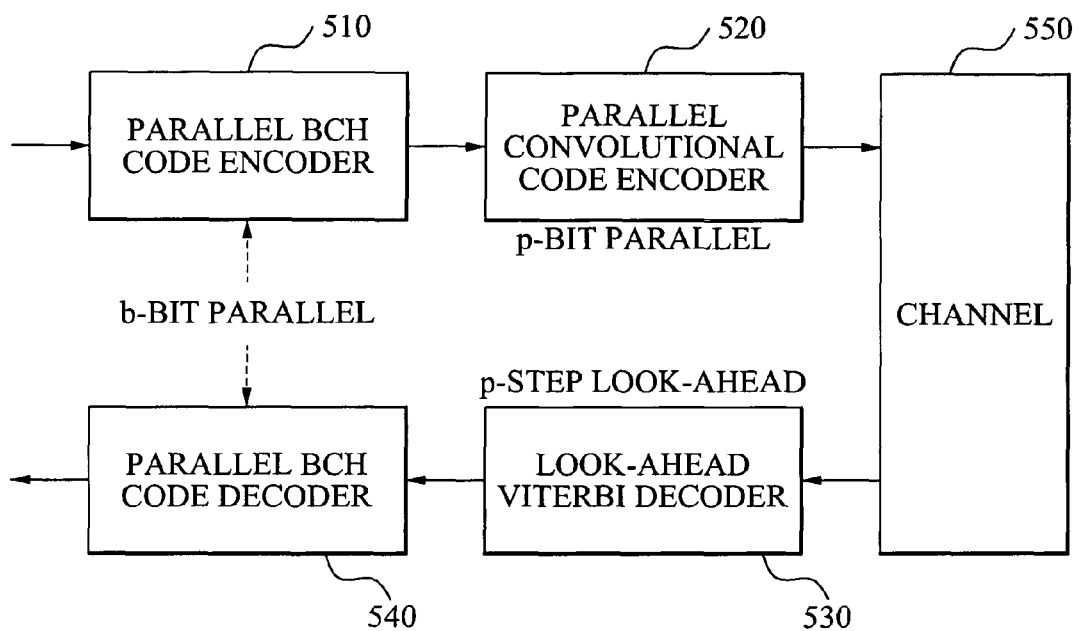
FIG. 5 illustrates an encoding apparatus and a corresponding decoding apparatus according to an example embodiment.

FIG. 5 illustrates an encoding apparatus and a corresponding decoding apparatus according to an example embodiment.

Referring to FIG. 5, the encoding apparatus may include a parallel Bose, Ray-Chaudhuri, Hocquenghem (BCH) code encoder 510 and a parallel convolutional code encoder 520. The parallel convolutional code encoder 520 may be implemented as the encoding apparatus shown in FIG. 1 or 3. The decoding apparatus may include a look-ahead Viterbi decoder 530 and a parallel BCH code decoder 540.

The parallel BCH code encoder 510 may receive an input information bit stream and encode the input information bit stream using a BCH code encoding scheme to generate an outer encoded bit stream. The parallel BHC code encoder 510 may generate the outer encoded bit stream using, for example, b-bit parallel encoding, where b is a rational number.

The parallel convolutional code encoder 520 receives the outer encoded bit stream and may encode the outer encoded bit stream to generate an inner encoded bit stream. The parallel convolutional code encoder 520 may p-bit parallel encode the received outer encoded bit stream, where p is a rational number. The inner encoded bit stream may be a convolutional code. P-bit parallel encoding of the parallel convolutional code encoder 520 may significantly reduce encoding time. The inner encoded bit stream may be transmitted to the look-ahead Viterbi decoder 530 via a channel 550.

The inner encoded bit stream passing through the channel 550 may be transformed due to one or more channel characteristics. The transformation may cause one or more errors in the inner encoded bit stream. The encoding and/or decoding process may generate an ECC for restoring an outer input bit stream, irrespective of the error caused by the channel characteristics.

In one example, the channel 550 may be a path through which a bit stream is transmitted over the air. Alternatively, the channel 550 may refer to a process for which a bit stream is stored in a memory, and read from the memory after a period of time.

The look-ahead Viterbi decoder 530 may decode the inner encoded bit stream received via the channel 550 using a look-ahead Viterbi decoding scheme to obtain the outer encoded bit stream. The look-ahead Viterbi decoder 530 may decode the inner encoded bit stream using, for example, a p-step look-ahead Viterbi decoding scheme. The p-step look-ahead Viterbi decoding may correspond to the p-bit parallel encoding of the parallel convolutional code encoder 520, and thus, may reduce decoding time.

In an example in which the channel 550 is a memory, the look-ahead Viterbi decoder 530 may read the stored inner encoded bit stream from the memory, and decode the read inner encoded bit stream. A process of reading the inner encoded bit stream from the memory 550 by the look-ahead Viterbi decoder 530 may constitute a part of the channel.

The parallel BCH code decoder 540 receives the outer encoded bit stream, and may decode the received outer encoded bit stream using a BCH code decoding scheme to restore the outer input bit stream. The parallel BCH code decoder 540 may restore the outer input bit stream using, for example, b-bit parallel decoding.

The parallel BCH code encoder 510 and the parallel BCH code decoder 520 may perform b-bit parallel encoding and decoding, respectively. The b-bit parallel encoding and decoding may reduce a code encoding time.

The parallel BCH code encoder 510 and the parallel BHC code decoder 540 may function as an outer encoder and an outer decoder, respectively. The parallel convolutional code encoder 520 and the look-ahead Viterbi decoder 530 function as an inner encoder and an inner decoder, respectively. Accordingly, the parallel BCH code encoder 510 and the parallel convolutional code encoder 520 may constitute a concatenated encoder, and the parallel BCH code decoder 540 and the look-ahead Viterbi decoder 530 may constitute a concatenated decoder.

The concatenated encoder and the concatenated decoder may improve ECC performance, but may increase code encoding time and/or decoding time.

A code encoding apparatus and a code decoding apparatus according to example embodiments may use a concatenated encoder and a concatenated decoder. An outer encoder and outer decoder may perform code encoding and decoding processes using b-bit parallel coding. An inner encoder may perform the code encoding process using, for example, p-bit parallel encoding, and an inner decoder may perform the code decoding process using, for example, a p-step look-ahead Viterbi decoding process. Through the above operation, code encoding and decoding times may be reduced.

In example embodiments, when an operational speed of the inner encoder and/or decoder less than or similar to the outer encoder and/or decoder, a number of bits (e.g., p bits) to be processed in parallel by the inner encoder and/or decoder may be less than or equal to b, which is a number of bits to be processed in parallel by the outer encoder and decoder.

When the channel 550 is a memory, the memory may include a multi-bit cell (MBC) capable of storing multi-bit data in a single cell.

Figure 6:
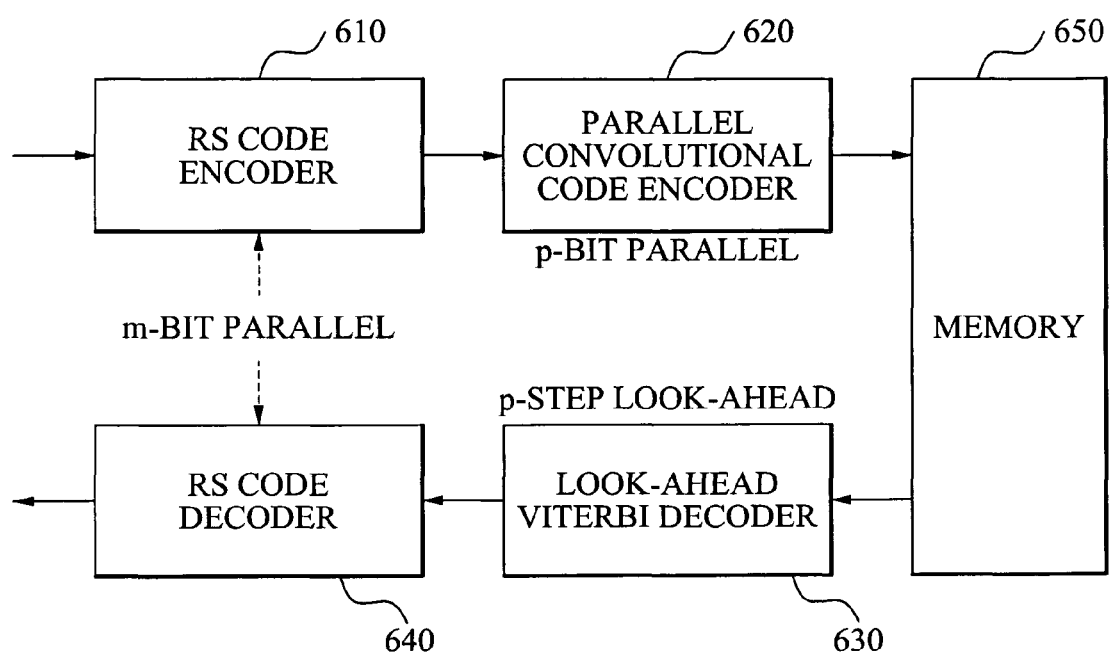
FIG. 6 illustrates an encoding apparatus and a corresponding decoding apparatus according to another example embodiment.

FIG. 6 illustrates a code encoding apparatus and corresponding code decoding apparatus according to another example embodiment.

Referring to FIG. 6, the code encoding apparatus may include a Reed-Solomon (RS) code encoder 610 and a parallel convolutional code encoder 620. The parallel convolutional code encoder 620 may be implemented as the encoding apparatus shown in FIG. 1 or 3. The code decoding apparatus may include a look-ahead Viterbi decoder 630 and an RS code decoder 640.

The RS code encoder 610 may receive an input information bit stream and encode the input information bit stream using an RS code encoding scheme to generate an outer encoded bit stream. The RS code encoder 610 may generate the outer encoded bit stream using m-bit parallel encoding.

The parallel convolutional code encoder 620 may receive the outer encoded bit stream and encode the outer encoded bit stream to generate an inner encoded bit stream. The parallel convolutional code encoder 620 may encode, in parallel (e.g., p-bit parallel), the received outer encoded bit stream. The generated inner encoded bit stream may be a convolutional code. The p-bit parallel encoding of the parallel convolutional code encoder 620 may reduce (e.g., significantly reduce) encoding time. The inner encoded bit stream may be stored in a memory 650 or pass through a channel similar to the channel 550 shown in FIG. 5.

The look-ahead Viterbi decoder 630 may read the stored inner encoded bit stream from the memory 650 and decode the read inner encoded bit stream using a look-ahead Viterbi decoding scheme to restore the outer encoded bit stream. The look-ahead Viterbi decoder 630 may decode the inner encoded bit stream using, for example, a p-step look-ahead Viterbi decoding scheme. The p-step look-ahead Viterbi decoding scheme may correspond to p-bit parallel encoding of the parallel convolutional code encoder 620.

The RS code decoder 640 may receive the outer encoded bit stream and decode the received outer-encoded bit stream using an RS code decoding scheme to restore an outer input bit stream. The RS code decoder 640 may restore the outer input bit stream using, for example, m-bit parallel decoding, where m is a rational number.

The RS code encoder 610 and the RS code decoder 640 may perform m-bit parallel encoding and decoding, respectively. The m-bit parallel encoding and decoding may reduce a code encoding and decoding time.

The RS code encoder 610 and the RS code decoder 640 may function as an outer encoder and an outer decoder, respectively. The parallel convolutional code encoder 620 and the look-ahead Viterbi decoder 630 may function as an inner encoder and an inner decoder, respectively. Accordingly, the RS code encoder 610 and the parallel convolutional code encoder 620 may constitute a concatenated encoder, and the RS code decoder 640 and the look-ahead Viterbi decoder 630 may constitute a concatenated decoder.

According to at least some example embodiments, code encoding apparatuses and a code decoding apparatuses may use concatenated encoders and concatenated decoders. In addition, an outer encoder and outer decoder may perform code encoding and decoding processes using, for example, m-bit parallel coding, and an inner encoder and inner decoder may perform code encoding and decoding processes using, for example, p-bit parallel encoding. Through the above-discussed operations, encoding and decoding time may be reduced.

In example embodiments, when an operational speed of the inner encoder and decoder is less than, similar to or the same as the outer encoder and decoder, a number of bits (e.g., p bits) to be processed in parallel by the inner encoder and decoder may be less than or equal to m, which is a number of bits to be processed in parallel by the outer encoder and decoder.

Figure 7:
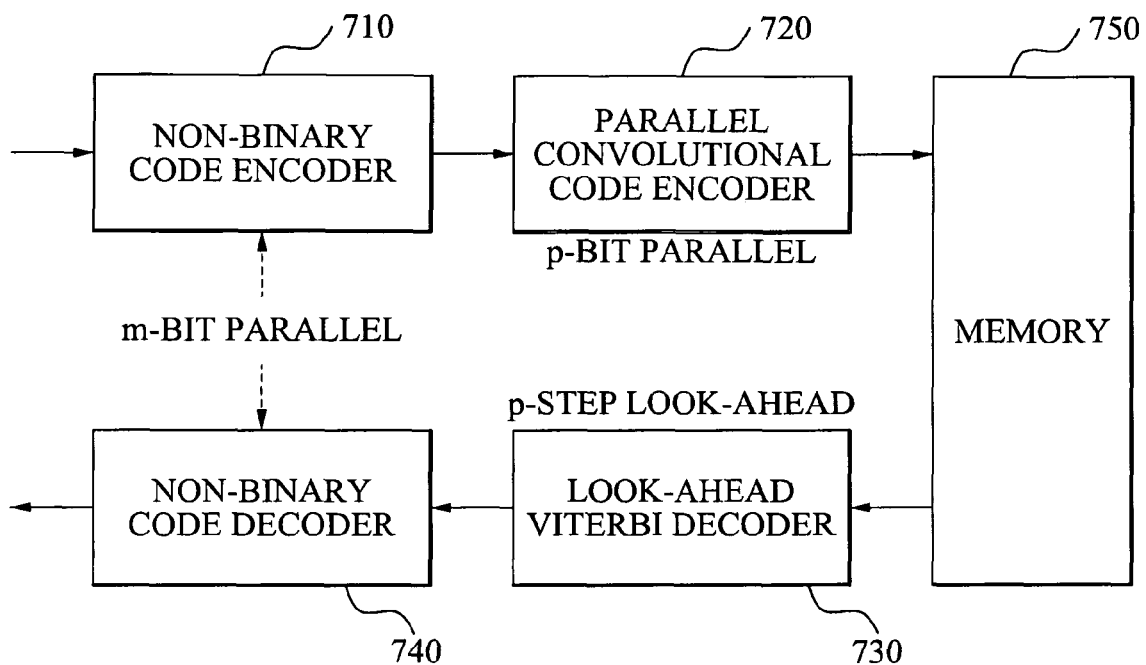
FIG. 7 illustrates an encoding apparatus and a corresponding decoding apparatus according to yet another example embodiment.

FIG. 7 illustrates a code encoding apparatus and a corresponding code decoding apparatus according to another example embodiment.

Referring to FIG. 7, the code encoding apparatus may include a non-binary code encoder 710 and a parallel convolutional code encoder 720. The parallel convolutional code encoder 720 may be implemented as the encoding apparatus shown in FIG. 1 or 3. The code decoding apparatus may include a look-ahead Viterbi decoder 730 and a non-binary code decoder 740.

The non-binary code encoder 710 may receive an input information bit stream and encode the input information bit stream using a non-binary code encoding scheme to generate an outer encoded bit stream. In example embodiments, the non-binary code encoder 710 may generate the outer encoded bit stream using m-bit parallel encoding. The parallel convolutional code encoder 720 may receive the outer encoded bit stream and encode the outer encoded bit stream to generate an inner encoded bit stream. The parallel convolutional code encoder 720 may p-bit parallel encode the received outer encoded bit stream. The inner encoded bit stream may be a convolutional code. P-bit parallel encoding of the parallel convolutional code encoder 720 may reduce (e.g., significantly reduce) encoding time.

The inner encoded bit stream may be stored in a memory 750 or pass through a channel similar to the channel 550 in FIG. 5. If the inner encoded bit stream is stored in the memory 750, the look-ahead Viterbi decoder 730 may read the stored inner encoded bit stream from the memory 750 and decode the read inner encoded bit stream using a look-ahead Viterbi decoding scheme to restore the outer encoded bit stream. The look-ahead Viterbi decoder 730 may decode the inner encoded bit stream using a p-step look-ahead Viterbi decoding scheme.

The non-binary code decoder 740 may receive the outer encoded bit stream from the look-ahead Viterbi decoder 730 and decode the received outer encoded bit stream using a non-binary code decoding scheme to restore an outer input bit stream. The non-binary code decoder 740 may restore the outer input bit stream using, for example, m-bit parallel decoding.

The non-binary code encoder 710 and the non-binary code decoder 740 may perform, for example, m-bit parallel encoding and m-bit parallel decoding, respectively. The m-bit parallel encoding and decoding may reduce respective encoding and decoding times.

The non-binary code encoder 710 and the non-binary code decoder 740 may function as an outer encoder and outer decoder, respectively. The parallel convolutional code encoder 720 and the look-ahead Viterbi decoder 730 may function as an inner encoder and inner decoder, respectively. Accordingly, the non-binary code encoder 710 and the parallel convolutional code encoder 720 may constitute a concatenated encoder. The non-binary code decoder 740 and the look-ahead Viterbi decoder 730 may constitute a concatenated decoder.

Code encoding apparatuses and code decoding apparatuses according to example embodiments may utilize a concatenated encoder and a concatenated decoder. Also, an outer encoder and decoder may perform code encoding and decoding processes using, for example, m-bit parallel coding. An inner encoder and an inner decoder may perform code encoding and/or decoding process using, for example, p-bit parallel encoding. Through the above operations, code encoding and decoding process times may be reduced.

In example embodiments, when an operational speed of the inner encoder and/or decoder less than, similar to or the same as the outer encoder and/or decoder, a number of bits (e.g., p) to be processed in parallel by the inner encoder and/or decoder may be less than or equal to m, which is a number of bits to processed in parallel by the outer encoder and decoder.

Figure 8:
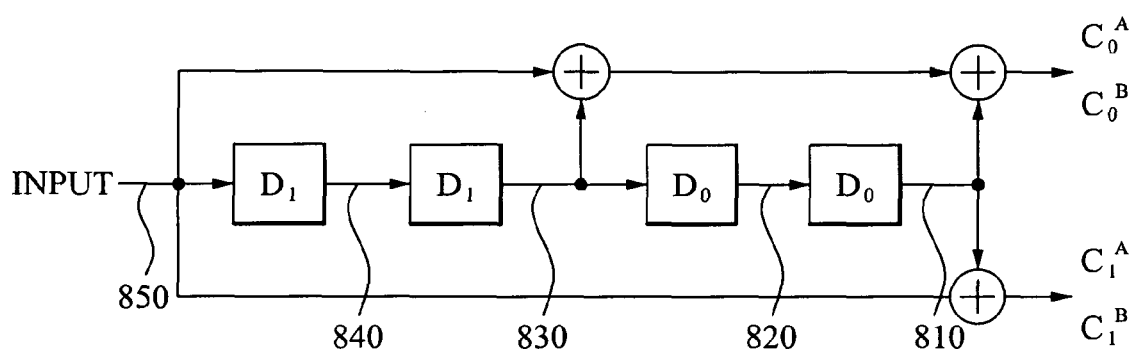
FIG. 8 illustrates an encoding apparatus according to another example embodiment.

FIG. 8 illustrates a code encoding apparatus according to another example embodiment.

Referring to FIG. 8, the code encoding apparatus may include, for example, four delay elements and three adders. In example operation, the code encoding apparatus may receive one-bit input information 850 and generate a multi-bit (e.g., two-bit) code.

The code encoding apparatus may generate first delayed information 840 after one clock based on the input information 850. The code encoding apparatus may generate second delayed information 830 after one clock based on the first delayed information 840.

When the input information 850 is $i(T)$, the first delayed information 840 may be represented as $i(T-\tau)$, and the second delayed information 830 may be represented as $i(T-2\tau)$, where T represents a time index and $\tau$ represents one clock.

Still referring to FIG. 8, third delayed information 820 may be generated after one clock based on the second delayed information 830. The third delayed information 820 may be represented as $i(T-3\tau)$. Fourth delayed information 810 may be generated after one clock based on the third delayed information 820. The fourth delayed information 810 may be represented as $i(T-4\tau)$.

Codes $C_0$ and $C_1$ generated by the code encoding apparatus may be represented by Equations 7 and 8, respectively. Equations 7 and 8 are shown below.

$$C_0 = i(T) + i(T-2\tau) + i(T-4\tau) \qquad \text{[Equation 7]}$$

$$C_1 = i(T) + i(T-4\tau) \qquad \text{[Equation 8]}$$

As shown in Equations 7 and 8, the codes $C_0$ and $C_1$ may be generated based on the input information 850 and the delayed information 810 and 830 after even multiples of one clock. Accordingly, the input information 850, and the codes $C_0$ and $C_1$ may constitute two independent sub-sequences, and each of the independent sub-sequences may be processed by crossing each other by one clock.

A code encoding scheme of generating at least two independent sub-sequences is referred to as an interleaved encoding scheme.

The independent sub-sequences may be referred to as a sub-sequence A and a sub-sequence B respectively. The codes $C_0$ and $C_1$ generated based on the sub-sequence A may be indicated as $C_0^A$ and $C_1^A$, respectively. The codes $C_0$ and $C_1$ generated based on the sub-sequence B may be indicated as $C_0^B$ and $C_1^B$, respectively.

FIG. 9 is a table for illustrating an example of a process of generating a code by the code encoding apparatus of FIG. 8.

Referring to FIG. 9, when T=1, codes $C_0$ and $C_1$ may have a value of input $i_0$. In FIG. 9, one clock is assumed to be τ=1. When T is odd, sub-sequence A may be used, but when T is even sub-sequence B may be used.

$D_0$ and $D_1$ in FIG. 9 indicate the delayed information 810 and the 830 in FIG. 8, respectively.

In one example, when T=6, the delayed information 810 stored in $D_0$ is $i_0^B$ and the delayed information 830 stored in $D_1$ is $i_1^B$. The code $C_0$ may have a value of $i_0^B + i_1^B + i_2^B$, and the code $C_1$ may have a value of $i_0^B + i_2^B$.

Figure 10:
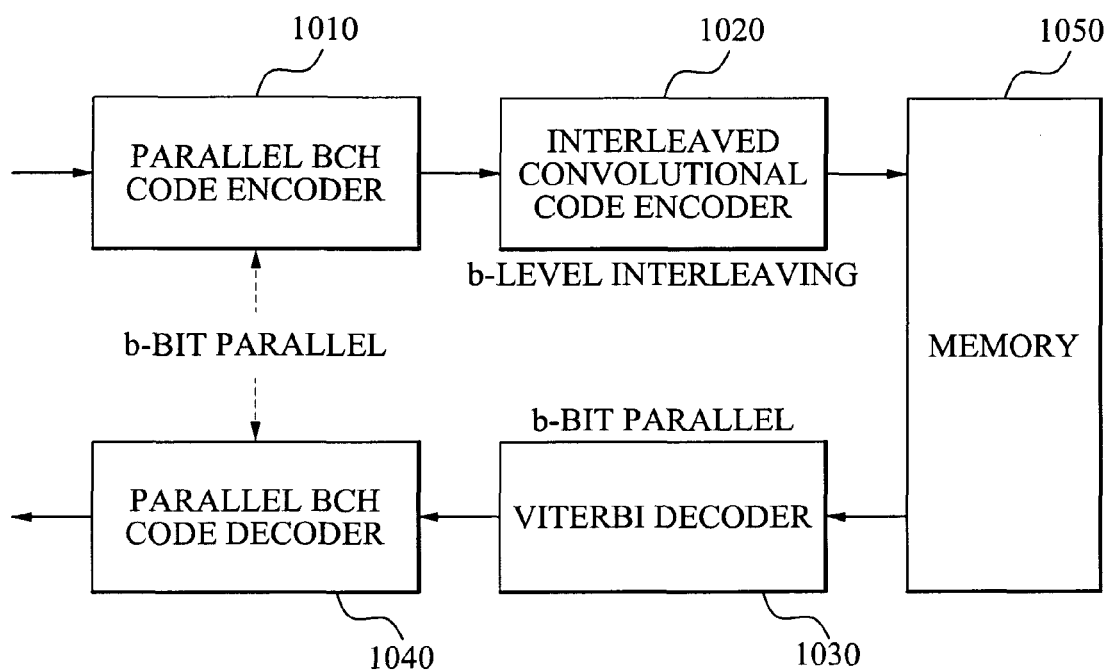
FIG. 10 illustrates an encoding apparatus and a corresponding decoding apparatus according to another example embodiment.

FIG. 10 illustrates a code encoding apparatus and corresponding code decoding apparatus according to yet another example embodiment.

Referring to FIG. 10, the code encoding apparatus may include a parallel BCH code encoder 1010 and an interleaved convolutional code encoder 1020. The interleaved convolutional code encoder 1020 may be implemented as the encoding apparatus of FIG. 8. The code decoding apparatus may include a Viterbi decoder 1030 and a parallel BCH code decoder 1040.

In example operation, the parallel BCH code encoder 1010 may receive an input information bit stream and encode the input information bit stream using a BCH code encoding scheme to generate an outer encoded bit stream. In example embodiments, the parallel BCH code encoder 1010 may generate the outer encoded bit stream using, for example, b-bit parallel encoding.

The interleaved convolutional code encoder 1020 may receive the outer encoded bit stream from the parallel BCH encoder 1010 and encode the outer encoded bit stream to generate an inner encoded bit stream. The interleaved convolutional code encoder 1020 may encode the received outer encoded bit stream using, for example, a b-level interleaved convolutional code encoding scheme.

The inner encoded bit stream may be stored in a memory 1050 or pass through a channel similar to the channel 550 shown in FIG. 5.

If the inner encoded bit stream is stored in the memory 1050, the Viterbi decoder 1030 may read the stored inner encoded bit stream from the memory 1050 and decode the read inner encoded bit stream using a Viterbi decoding scheme to restore the outer encoded bit stream. The Viterbi decoder 1030 may decode the inner encoded bit stream using, for example, b-bit parallel decoding. Each parallel component of the Viterbi decoder 1030 may correspond to each sub-sequence of the interleaved convolutional code encoder 1020.

Parallel decoding of the Viterbi decoder 1030 and interleaved encoding of the interleaved convolutional code encoder 1020 that enables the parallel decoding may reduce code encoding and decoding times.

The parallel BCH code decoder 1040 may receive the outer encoded bit stream from the Viterbi decoder 1030 and decode the received outer encoded bit stream using a BCH code decoding scheme to restore an outer input bit stream. In example embodiments, the parallel BCH code decoder 1040 may restore the outer input bit stream using, for example, b-bit parallel decoding.

The parallel BCH code encoder 1010 and the parallel BCH code decoder 1040 may perform b-bit parallel encoding and decoding, respectively. The b-bit parallel encoding and decoding may reduce code encoding and decoding times.

The parallel BCH code encoder 1010 and the parallel BCH code decoder 1040 may function as an outer encoder and an outer decoder, respectively. The interleaved convolutional code encoder 1020 and the Viterbi decoder 1030 may function as an inner encoder and an inner decoder, respectively. Accordingly, the parallel BCH code encoder 1010 and the interleaved convolutional code encoder 1020 may constitute a concatenated encoder. The parallel BCH code decoder 1040 and the Viterbi decoder 1030 may constitute a concatenated decoder.

A code encoding apparatus and a code decoding apparatus according to example embodiments may perform code encoding and decoding using, for example, a b-bit parallel encoding and decoding scheme, while using a concatenated encoder and a concatenated decoder. Through the above operations, code encoding and decoding times may be reduced.

The inner encoded bit stream stored in the memory 1050 may be divided into b independent subsequences. The parallel BCH code decoder 1040 may decode the outer encoded bit stream using, for example, the b-bit parallel decoding scheme.

According to at least one example embodiment, the memory 1050 may include a MBC memory capable of storing multi-bit data in a single cell, and the BCH code encoding scheme may be a type of a linear block code encoding scheme.

Figure 11:
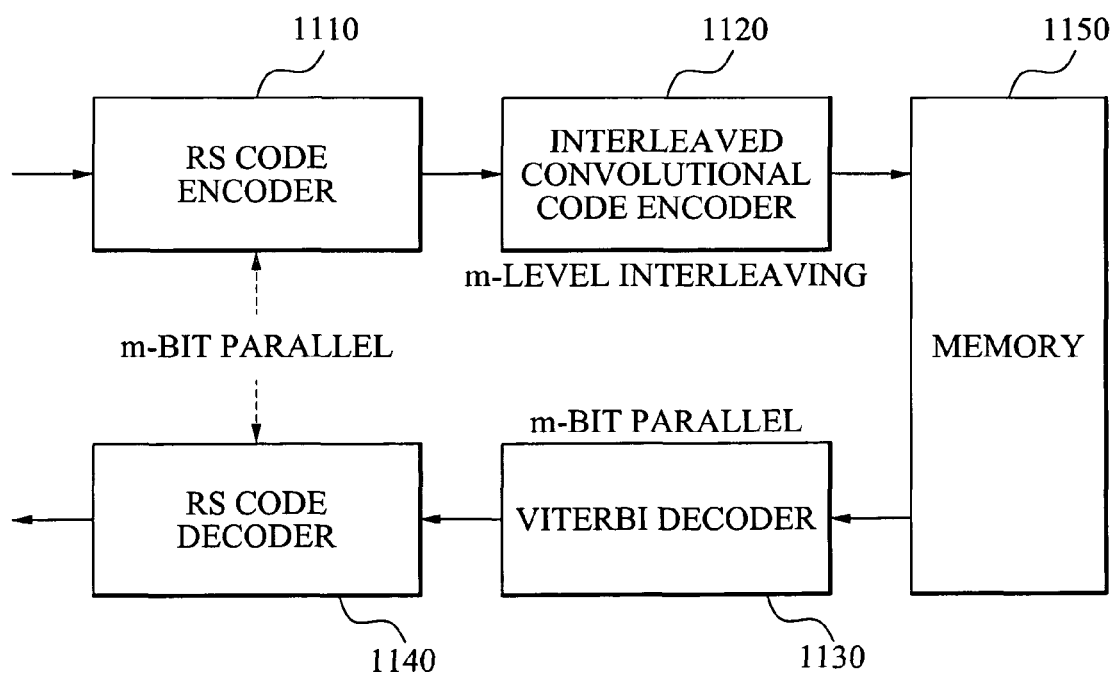
FIG. 11 illustrates an encoding apparatus and a corresponding decoding apparatus according to yet another example embodiment.

FIG. 11 illustrates a code encoding apparatus and a corresponding code decoding apparatus according to an example embodiment.

Referring to FIG. 11, the code encoding apparatus may include an RS code encoder 1110 and an interleaved convolutional code encoder 1120. The interleaved convolutional code encoder 1120 may be implemented as the encoding apparatus of FIG. 8. The code decoding apparatus may include a Viterbi decoder 1130 and an RS code decoder 1140.

The RS code encoder 1110 may receive an input information bit stream and encode the input information bit stream using an RS code encoding scheme to generate an outer encoded bit stream. In example embodiments, the RS code encoder 1110 may generate the outer encoded bit stream using, for example, m-bit parallel encoding.

The interleaved convolutional code encoder 1120 may receive an outer encoded bit stream and encode the outer encoded bit stream to generate an inner encoded bit stream. The interleaved convolutional code encoder 1120 may receive the outer encoded bit stream, and encode the received outer encoded bit stream using, for example, an m-level interleaved convolutional code encoding scheme. The inner encoded bit stream may be stored in a memory 1150 or pass through a channel similar to the channel 550 shown in FIG. 5.

If the inner encoded bit stream is stored in the memory 1150, the Viterbi decoder 1130 may read the stored inner encoded bit stream from the memory 1150 and decode the read inner encoded bit stream using a Viterbi decoding scheme to restore the outer encoded bit stream. The Viterbi decoder 1130 may decode the inner encoded bit stream using, for example, m-bit parallel decoding. Each parallel component of the Viterbi decoder 1130 may correspond to each sub-sequence of the interleaved convolutional code encoder 1120.

Parallel decoding of the Viterbi decoder 1130 and interleaved encoding of the interleaved convolutional code encoder 1120 that enables the parallel decoding may reduce code encoding and decoding times.

The RS code decoder 1140 may receive the outer encoded bit stream and decode the outer encoded bit stream using an RS code decoding scheme to restore an outer input bit stream. In example embodiments, the RS code decoder 1140 may restore the outer input bit stream using, for example, m-bit parallel decoding.

The RS code encoder 1110 and the RS code decoder 1140 may perform m-bit parallel encoding and decoding, respectively. The m-bit parallel encoding and decoding may reduce a code encoding and decoding times.

The RS code encoder 1110 and the RS code decoder 1140 may function as an outer encoder and an outer decoder, respectively. The interleaved convolutional code encoder 1120 and the Viterbi decoder 1130 may function as an inner encoder and an inner decoder, respectively. Accordingly, the RS code encoder 1110 and the interleaved convolutional code encoder 1120 may constitute a concatenated encoder. The RS code decoder 1140 and the Viterbi decoder 1130 may constitute a concatenated decoder.

Code encoding apparatuses and code decoding apparatuses according to example embodiments may perform code encoding and decoding using, for example, an m-bit parallel encoding and/or decoding scheme, while using the concatenated encoder and the concatenated decoder. Through the above operation, a code encoding and/or decoding time may be reduced. The RS code encoding scheme may be, for example, a type of a linear block code encoding scheme.

Figure 12:
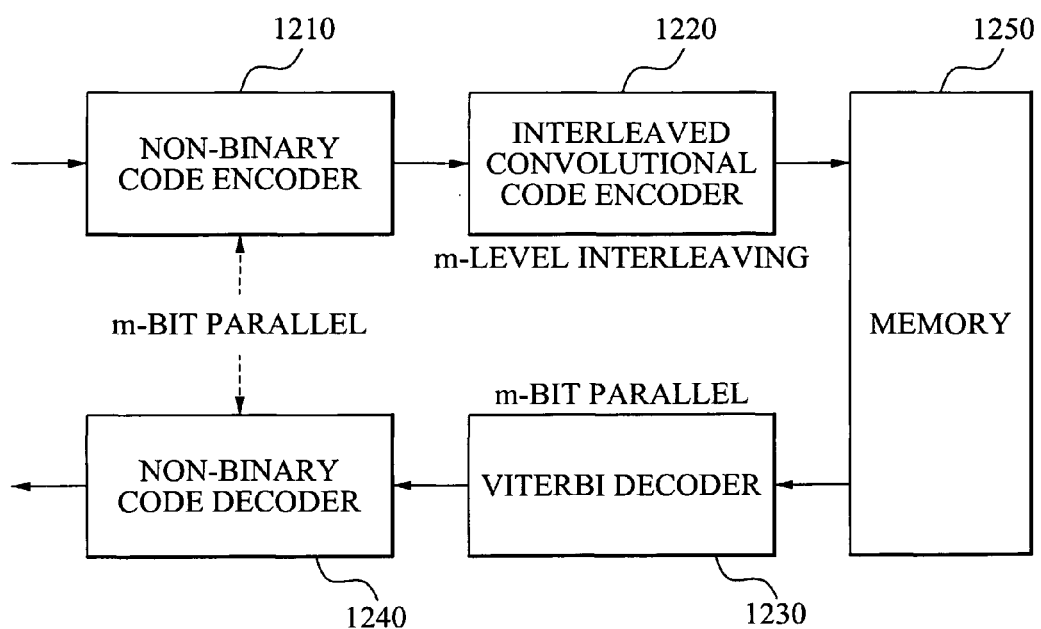
FIG. 12 illustrates an encoding apparatus and a corresponding decoding apparatus according to yet another example embodiment.

FIG. 12 illustrates a code encoding apparatus and a corresponding code decoding apparatus according to another example embodiment.

Referring to FIG. 12, the code encoding apparatus may include a non-binary code encoder 1210 and an interleaved convolutional code encoder 1220. The interleaved convolutional code encoder 1220 may be implemented as the encoding apparatus of FIG. 8. The code decoding apparatus may include a Viterbi decoder 1230 and a non-binary code decoder 1240.

The non-binary code encoder 1210 may receive an input information bit stream and encode the input information bit stream using a non-binary code encoding scheme to generate an outer encoded bit stream. In example embodiments, the non-binary code encoder 1210 may generate the outer encoded bit stream using, for example, m-bit parallel encoding.

The interleaved convolutional code encoder 1220 may receive the outer encoded bit stream and encode the outer encoded bit stream using, for example, an m-level interleaved convolutional code encoding scheme to generate an inner encoded bit stream. The inner encoded bit stream may be stored in a memory 1250 or pass through a channel similar to the channel 550 shown in FIG. 5.

If the inner encoded bit stream is stored in the memory 1250, the Viterbi decoder 1230 may read the stored inner encoded bit stream from the memory 1250 and decode the read inner encoded bit stream using a Viterbi decoding scheme to restore the outer encoded bit stream. The Viterbi decoder 1230 may decode the inner encoded bit stream using, for example, m-bit parallel decoding. Each parallel component of the Viterbi decoder 1230 may correspond to each sub-sequence of the interleaved convolutional code encoder 1220. Parallel encoding of the Viterbi decoder 1230 and interleaved encoding of the interleaved convolutional code encoder 1220 that enables the parallel encoding may reduce (e.g., significantly reduce) a encoding and decoding times.

The non-binary code decoder 1240 may receive the outer encoded bit stream from the Viterbi decoder 1230 and decode the outer encoded bit stream using, for example, a non-binary code decoding scheme to restore an outer input bit stream. In example embodiments, the non-binary code decoder 1240 may restore the outer input bit stream using, for example, m-bit parallel decoding.

The non-binary code encoder 1210 and the non-binary code decoder 1240 may perform, for example, m-bit parallel encoding and decoding, respectively. The m-bit parallel encoding and/or decoding may reduce encoding and decoding times.

The non-binary code encoder 1210 and the non-binary code decoder 1240 may function as an outer encoder and an outer decoder, respectively. The interleaved convolutional code encoder 1220 and the Viterbi decoder 1230 may function as an inner encoder and an inner decoder, respectively. Accordingly, the non-binary code encoder 1210 and the interleaved convolutional code encoder 1220 may constitute a concatenated encoder. The non-binary code decoder 1240 and the Viterbi decoder 1230 may constitute a concatenated decoder.

Code encoding apparatuses and code decoding apparatuses according to example embodiments may perform code encoding and decoding using, for example, an m-bit parallel encoding and decoding schemes, while using the concatenated encoder and the concatenated decoder. Through the above operation, code encoding and decoding times may be reduced.

The non-binary code encoding scheme may be, for example, a type of a linear block code encoding scheme.

Figure 13:
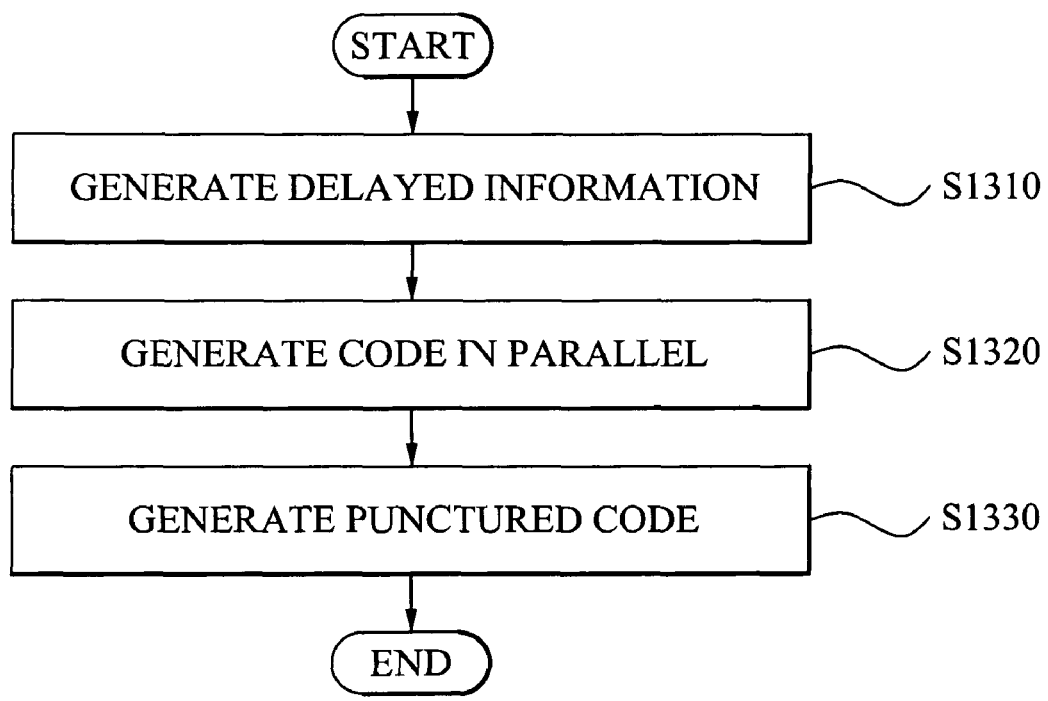
FIG. 13 is a flowchart illustrating an encoding method according to an example embodiment.

FIG. 13 is a flowchart illustrating an encoding method according to an example embodiment.

Referring to FIG. 13, at S1310 p-bit input information may be delayed by at least one clock to generate delayed information. At S1320 an n·p-bit code may be generated based on at least one of the input information and the delayed information. Each bit of the n·p-bit code may be generated in parallel based on at least one of each bit of the input information and each bit of the delayed information corresponding to each bit of the input information.

At S1330 the n·p-bit code may be punctured to generate a punctured code, for example, a convolutional code.

In example embodiments, the generated code may be decoded using a look-ahead Viterbi decoding scheme. The look-ahead Viterbi decoding scheme may be, for example, a p-step look-ahead Viterbi decoding scheme. The code encoding method may further include receiving and encoding outer input information to generate the input information. The encoding of the outer input information may be an outer encoding operation, and the encoding of the input information may be an inner encoding operation. The code encoding method may be concatenated encoding.

Figure 14:
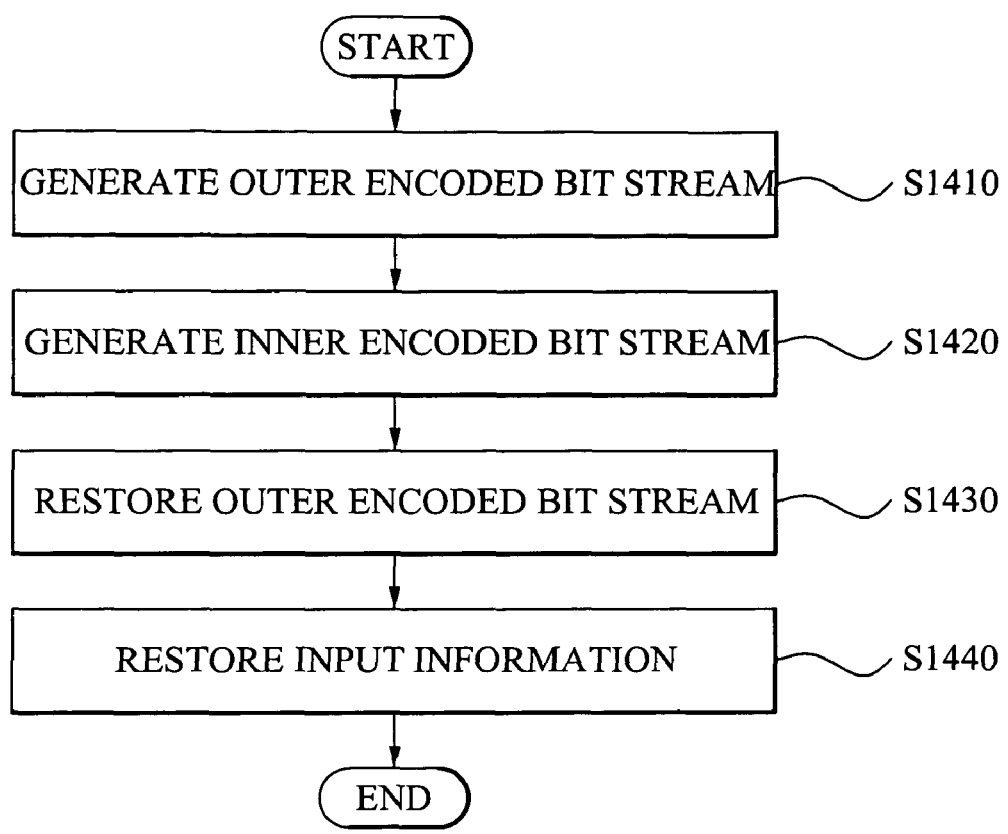
FIG. 14 is a flowchart illustrating an encoding/decoding method according to an example embodiment.

FIG. 14 is a flowchart illustrating a code encoding/decoding method according to an example embodiment.

Referring to FIG. 14, at S1410 input information may be encoded using an outer encoding scheme to generate an outer encoded bit stream. At S1420 the outer encoded bit stream may be inner encoded using an interleaved convolutional code encoding scheme to generate an inner encoded bit stream. At S1430 the inner encoded bit stream may be decoded using a parallel Viterbi decoding scheme to restore the outer encoded bit stream. At S1440 the outer encoded bit stream may be decoded using an outer decoding scheme corresponding to the outer encoding scheme to restore the input information.

In example embodiments, the outer encoding scheme may be, for example, a liner block code encoding scheme. The interleaved convolutional code encoding scheme may use, for example, an m-level interleaved convolutional code encoding scheme, and the parallel Viterbi decoding scheme may be, for example, an m-bit parallel decoding corresponding to a level of an interleaved convolutional code encoding scheme. Each parallel component of the parallel Viterbi decoding scheme may correspond to each sub-sequence of the interleaved convolutional code encoding scheme.

The code encoding and decoding method according to example embodiments may be recorded in computer-readable media including program instructions or computer executable instructions for implementing various operations embodied when executed by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Code encoding and decoding apparatuses and/or methods according to example embodiments may apply an error correction method to a multi-level cell (MLC) memory device to increase a number of bits stored in a single memory cell. In addition, code encoding/decoding apparatuses and/or methods according to example embodiments may reduce encoding and decoding times of an error correction code (ECC) for error correction.

Code encoding/decoding apparatuses and/or methods according to example embodiments may also reduce complexity of hardware required for encoding and decoding operations of an ECC.

While example embodiments have been particularly shown and described, it will be understood by those of ordinary skill in the art that various changes in form and details may be made therein without departing from the spirit and scope of the present invention as defined by the following claims.

What is claimed is:

1. A code encoding apparatus comprising:
a delay circuit configured to generate delayed information by delaying each bit of p-bit input information by only a single clock, the p-bit input information being received in parallel; and
a code generator configured to generate n·p-bit code based on at least one of the p-bit input information and the delayed information, where n is a rational number.

2. The apparatus of claim 1, wherein each bit of the n·p-bit code is generated in parallel based on at least one of the input information and corresponding delayed information.

3. The apparatus of claim 1, wherein the n·p-bit code is a convolutional code.

4. The apparatus of claim 1, further including,
an outer encoder configured to encode outer input information to generate the p-bit input information.

5. The apparatus of claim 4, wherein the outer encoder encodes the outer input information using a parallel Bose, Ray-Chaudhuri, Hocquenghem (BCH) code encoding scheme.

6. The apparatus of claim 4, wherein the outer encoder encodes the outer input information using a Reed-Solomon (RS) code encoding scheme.

7. The apparatus of claim 4, wherein the outer encoder encodes the outer input information using a non-binary code encoding scheme.

8. The apparatus of claim 1, further including,
a memory configured to store the n·p-bit code.

9. The apparatus of claim 8, wherein the memory includes a multi-bit cell (MBC) memory configured to store multi-bit data in one cell.

10. The apparatus of claim 1, further including,
a decoder configured to restore the p-bit input information by decoding the N·p-bit code using a look-ahead Viterbi decoding scheme.

11. An apparatus comprising:
an inner encoder configured to generate an inner encoded bit stream by encoding an input information bit stream using an interleaved convolutional code encoding scheme; and
an inner decoder configured to restore the input information bit stream by decoding the inner encoded bit stream using a parallel Viterbi decoding scheme; wherein
the inner encoder is configured to combine input information bits of the input information bit stream with delayed input information bits of the input information bit stream, the delayed input information bits being delayed only after even multiples of a clock.

12. The apparatus of claim 11, further including,
an outer encoder configured to generate the input information bit stream by encoding an outer input information bit stream using an outer encoding scheme; and
an outer decoder configured to restore the outer input information bit stream by decoding the restored input information bit stream using an outer decoding scheme, the outer decoding scheme corresponding to the outer encoding scheme.

13. The apparatus of claim 12, wherein the outer encoding scheme is a linear block code encoding scheme.

14. The apparatus of claim 12, wherein the outer encoder encodes the outer input information bit stream using a parallel BCH code encoding scheme.

15. The apparatus of claim 12, wherein the outer encoder encodes the outer input information bit stream using an RS code encoding scheme.

16. The apparatus of claim 12, wherein the outer encoder encodes the outer input information bit stream using a non-binary code encoding scheme.

17. The apparatus of claim 12, wherein the inner encoder encodes the input information bit stream using an m-level interleaved convolutional code encoding scheme, and the inner decoder decodes, in parallel, the inner encoded bit stream of m bits corresponding to a level of the interleaved convolutional code encoding scheme.

18. The apparatus of claim 17, wherein the outer encoder encodes, in parallel, the outer input information of m bits corresponding to a level of the interleaved convolutional code encoding scheme to generate the input information bit stream, and the outer decoder decodes, in parallel, the input information bit stream of m bits corresponding to a level of the interleaved convolutional code encoding scheme.

19. The apparatus of claim 11, further including,
a memory configured to store the inner encoded bit stream, wherein
the inner decoder is configured to read the stored inner encoded bit stream from the memory.

20. The apparatus of claim 19, wherein the memory includes,
an MBC memory configured to store multi-bit data in one cell.

21. A code encoding method comprising:
delaying each bit of p-bit input information by only a single clock to generate delayed information, the p-bit input information being received in parallel; and
generating an n·p-bit code based on at least one of the p-bit input information and the delayed information, each bit of the n·p-bit code being generated in parallel from at least one of the p-bit input information and corresponding delayed information, and where n a rational number.

22. The method of claim 21, further including,
puncturing the n·p-bit code to generate a punctured code.

23. A method comprising:
encoding input information using an outer encoding scheme to generate an outer encoded bit stream;
encoding the outer encoded bit stream using an interleaved convolutional code encoding scheme to generate an inner encoded bit stream;
decoding the inner encoded bit stream using a parallel Viterbi decoding scheme to restore the outer encoded bit stream; and
decoding the outer encoded bit stream using an outer decoding scheme corresponding to the outer encoding scheme to restore the input information; wherein
the encoding of the outer encoded bit stream includes,
combining outer encoded bits of the outer encoded bit stream with delayed outer encoded bits of the outer encoded bit stream, the delayed outer encoded bits being delayed only after multiples of a clock.

24. The method of claim 23, wherein the interleaved convolutional code encoding scheme uses an m-level interleaved convolutional code encoding scheme, and the parallel Viterbi decoding scheme decodes, in parallel, the inner encoded bit stream of m bits corresponding to a level of the interleaved convolutional code encoding scheme.

25. A computer-readable recording medium storing computer executable instructions that when executed cause a computer to perform a method comprising:
delaying each bit of p-bit input information by only a single clock to generate delayed information, the p-bit input information being received in parallel; and
generating an n·p-bit code based on at least one of the p-bit input information and the delayed information, each bit of the n·p-bit code being generated in parallel from at least one of the p-bit input information and corresponding delayed information, where n is a rational number.

* * * * *